(12) United States Patent
Oshima et al.

(10) Patent No.: US 6,826,218 B2
(45) Date of Patent: Nov. 30, 2004

(54) SEMICONDUCTOR LASER DEVICE CAPABLE OF SUPPRESSING LEAKAGE CURRENT IN A LIGHT EMITTING END SURFACE AND METHOD FOR MANUFACTURING SAME

(75) Inventors: Noboru Oshima, Nara (JP); Masahiko Sakata, Souraku-gun (JP); Makoto Yokota, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/987,921

(22) Filed: Nov. 16, 2001

(65) Prior Publication Data

US 2002/0064200 A1 May 30, 2002

(30) Foreign Application Priority Data

Nov. 28, 2000 (JP) ......................................... 2000-361037

(51) Int. Cl.$^7$ ................................................ H01S 5/00
(52) U.S. Cl. ............................................ 372/49; 372/45
(58) Field of Search ...................................... 372/49, 45

(56) References Cited

U.S. PATENT DOCUMENTS

| | | | | | |
|---|---|---|---|---|---|
| 4,337,443 A | * | 6/1982 | Umeda et al. | ................. | 372/49 |
| 4,510,607 A | * | 4/1985 | Garcia et al. | ................. | 372/49 |
| 4,599,729 A | * | 7/1986 | Sasaki et al. | ................. | 372/49 |
| 5,208,468 A | * | 5/1993 | Kawanishi et al. | ............ | 257/98 |
| 5,228,047 A | * | 7/1993 | Matsumoto et al. | ........... | 372/45 |
| 5,260,231 A | * | 11/1993 | Kawanishi et al. | ............ | 438/38 |
| 5,841,584 A | * | 11/1998 | Takatani et al. | ............. | 359/586 |
| 6,323,052 B1 | * | 11/2001 | Horie et al. | ................... | 438/46 |
| 6,396,864 B1 | * | 5/2002 | O'Brien et al | ................. | 372/45 |

FOREIGN PATENT DOCUMENTS

| | | |
|---|---|---|
| JP | 1-289289 | 11/1989 |
| JP | 1-318270 | 12/1989 |
| JP | 3-101183 | 4/1991 |
| JP | 9-162496 | 6/1997 |
| JP | 11-121876 | 4/1999 |
| JP | 11-284279 | 10/1999 |

* cited by examiner

*Primary Examiner*—Don Wong
*Assistant Examiner*—Hung Tran Vy
(74) *Attorney, Agent, or Firm*—Nixon & Vanderhye P.C.

(57) ABSTRACT

For evaporating a protective coating on a light emitting end surface 51a of a laser chip 51, there is formed first an Si film 52a, which is free from generation of oxygen due to decomposition. Thus, there is created a coating in the vicinity of the light emitting end surface 51a immediately after start of evaporation process under conditions of low partial pressure of oxygen. At the same time, in the later evaporation process of the protective coating 52b, if oxygen is generated due to decomposition of the evaporation material $Al_2O_3$, and oxygen partial pressure is increased, collision or bonding of the oxygen with the end surface 51a is prevented, thereby decreasing damages given to the end surface 51a in the process of protective coating creation. Further, the Si film 52a has a film thickness as small as approx. 20 Å. This controls generation of leakage current in the Si film 52a (or the end surface 51a), and prevents negative influence on oscillation characteristics.

8 Claims, 7 Drawing Sheets

SEMICONDUCTOR LASER DEVICE CAPABLE OF SUPPRESSING LEAKAGE CURRENT IN A LIGHT EMITTING END SURFACE AND METHOD FOR MANUFACTURING SAME

BACKGROUND OF THE INVENTION

The present invention relates to a semiconductor laser device having a protective coating with a specified reflectance formed on light emitting end surface, and to a method for manufacturing the same.

As shown in FIG. 5, most semiconductor laser devices are composed of, for example, protective coatings 2a and 2b, each having an identical reflectance, formed on light emitting end surfaces 1a and 1b of a GaAs laser chip 1. Reference numeral 3 denotes an active layer of the laser chip 1. In the case where the protective coatings 2a and 2b are composed of $Al_2O_3$ in FIG. 5, if a refractive index of the $Al_2O_3$ film is set to 1.60 while a refractive index of the laser chip 1 is set to 3.50, a reflectance of the protective coatings 2a and 2b corresponding to a coating thickness d varies as shown in FIG. 6 (provided that a laser emission wavelength $\lambda$=7800 Å).

FIG. 6 indicates that regardless of the coating thickness d of the protective coatings 2a and 2b, the reflectance thereof is smaller than that of the case without the protective coatings 2a and 2b (i.e. the reflectance of the light emitting end surfaces 1a and 1b). The reflectance becomes smallest when an optical coating thickness (refractive index n×coating thickness d) is an odd multiple of $\lambda/4$, while the reflectance becomes approximately equal to that in the case without the protective coatings 2a and 2b when the optical coating thickness is an integral multiple of $\lambda/2$. This is because the refractive index (1.60) of the protective coatings 2a and 2b is smaller than the refractive index (3.50) of the GaAs laser chip 1.

Contrary to this, in the case where the refractive index of the protective coatings 2a and 2b is larger than the refractive index of the GaAs laser chip 1 (for example, if such material as Si is used as the protective coatings 2a and 2b, the reflectance thereof is larger than that in the case without the protective coatings 2a and 2b, regardless of the coating thickness), the reflectance becomes largest when the optical coating thickness is an odd multiple of $\lambda/4$, while the reflectance becomes approximately equal to that in the case without the protective coatings 2a and 2b when the optical coating thickness is an integral multiple of $\lambda/2$.

In the case of high output semiconductor laser devices with optical output as high as 20 mW or more, as shown in FIG. 7, for increasing optical output Pf from the side of a main emitting end surface (front end surface), the reflectance of the protective coating 12a on the side of the main emitting end surface 11a is generally set lower than that in the case without the protective coating 12a, while the reflectance of the protective coating 12b on the side of a rear emitting end surface 11b is set higher than that in the case without the protective coating 12b. For example, the reflectance of the protective coating ($Al_2O_3$) 12a is set to approx. 15% or less. This reflectance is obtained with the coating thickness of approx. 700 Å to 1600 Å.

The protective coating 12b on the rear emitting end surface 11b, if composed with use of a film having a refractive index larger than that of the laser chip 11, is not capable of providing a sufficiently high reflectance as a single layer. Accordingly, there are laminated an $Al_2O_3$ film with a thickness of $\lambda/4$ as a first layer 14 and a third layer 16, and an amorphous Si with a thickness of $\lambda/4$ as a second layer 15 and a fourth layer 17. Then finally, there is laminated an $Al_2O_3$ film with a thickness of $\lambda/2$ as a fifth layer 18. This makes it possible to form a protective coating 12b having a reflectance as high as approx. 85% or more. It is noted that reference numeral 13 denotes an active layer.

Description will now be given of a method for forming protective coatings 2a and 2b having the above-described reflectance on light emitting end surfaces 1a and 1b of a semiconductor laser chip 1.

First, as shown in FIG. 8, there is formed by scribing a cleavage line 25 extensively disposed between an electrode 22 of an arbitrary element in a semiconductor laser wafer 21 and an electrode 23 of an adjacent element in direction orthogonal to an emitting section (channel) 24. Then, as shown in FIG. 9, the semiconductor laser wafer 21 is cleaved and divided into a plurality of laser bars (bar-shaped laser chips) 26.

Next, as shown in FIG. 10, a plurality of the divided laser bars 26 are set in a laser bar fixing device 27 such that the electrodes 22 are laid on top of each other. All the laser bars 26 should be set so that an emitting end surface 28a and an emitting end surface 28b face the same side. Next, on the emitting end surfaces 28a and 28b of a laser bar 26 fixed to the laser bar fixing device 27, there is formed a protective coating having a specified reflectance, generally with use of a vacuum evaporator 29 exemplarily shown in FIG. 11. The vacuum evaporator 29 is provided with a vapor source 31, a holder 32 for holding a plurality of the laser bar fixing devices 27, and a crystal oscillator 33 for monitoring the thickness of evaporated films, all in a chamber 30.

Following description discusses procedures of forming the protective coating. First, in the case for evaporating a protective coating onto the emitting end surface 28a, the holder 32 is disposed such that the emitting end surface 28a of a laser bar 26 faces the vapor source 31 side as shown in FIG. 11. Then, the chamber 30 is evacuated through a duct 34. After a specified degree of vacuum is obtained, an evaporation material 35 put in the vapor source 31 is heated and evaporated by electron beams and the like so that a protective coating is evaporated onto the emitting end surface 28a of the laser. After evaporation is completed, the holder 32 is then rotated 180° for evaporating a protective coating onto the emitting end surface 28b based on the same procedures.

Here, a forming speed (evaporation rate) for forming a protective coating on the both light emitting end surfaces 28a and 28b is controlled to be approximately constant till completion of evaporation. The evaporation rate is in this case controlled with heating temperature. In the case of electron beam evaporation, therefore, the evaporation rate may be controlled with intensity of electron beams. It is well known that in the case of resistance heating, the evaporation rate is controlled with an amount of electric current passed through a resistance. The evaporation rate is generally set to the range between several Å/sec to 30 Å/sec with the evaporation material of $Al_2O_3$. Evaporation is conducted while coating thickness is monitored with use of the crystal oscillator 33. Evaporation is terminated when a specified coating thickness is obtained.

In the case of a high output type semiconductor laser device shown in FIG. 7, there is formed a low reflecting protective coating 12a (having a reflectance of approx. 15% or less) on the side of the main emitting end surface 11a, and then there is formed in succession a multilayered high reflecting protective coating 12b on the side of the rear emitting end surface 11b. The multilayered high reflecting protective coating 12b is composed of a laminated structure made up of: a first layer 14 and a third layer 16 each consisting of an $Al_2O_3$ film with a thickness equal to $\lambda/4$; a second layer 15 and a fourth layer 17 each consisting of an Si film with a thickness equal to $\lambda/4$; and a fifth layer 18 consisting of an $Al_2O_3$ film with a thickness equal to $\lambda/2$. For evaporation of this film, $Al_2O_3$ and Si are mounted on the vapor source 31 as evaporation materials 35. Then the first layer 14, the third layer 16, and the fifth layer 18 consisting of an $Al_2O_3$ film are evaporated through irradiation of the evaporation material $Al_2O_3$ with electron beams, and the second layer 15 and the fourth layer 17 consisting of an Si film is evaporated through irradiation of the evaporation material Si with electron beams.

For high input type semiconductor laser devices, as shown in FIG. 12, there has been proposed a method for forming a protective coating 42a on the side of a main emitting end surface 41a of a laser chip 41 utilizing high thermal conductivity of Si, in which an Si film 44 having high thermal conductivity is formed first and then a low reflecting protective coating 45 is formed (Japanese Patent Laid-Open Publication HEI No. 1-289289). In the drawing, reference numeral 42b denotes a multilayered high reflecting protective coating on the side of a rear emitting end surface 41b composed of a first layer 46, a second layer 47, a third layer 48, a fourth layer 49, and a fifth layer 50, and reference numeral 43 denotes an active layer.

In this example, heat generated in the vicinity of the main emitting end surface 41a by light emission of the semiconductor laser device is efficiently discharged by the Si film 44, which controls deterioration of the semiconductor laser device caused by long term supply of current. The Si film has a film thickness of around $\lambda/4$ (approx. 532 Å in an embodiment).

However, the above-stated background art semiconductor laser devices have a following problem. In forming protective coatings 2a, 2b, 12a, and 12b of laser chips 1 and 11 by evaporation, an oxide ($Al_2O_3$), that is a material of the protective coatings 2a, 2b, 12a, and 12b, is decomposed to generate oxygen immediately after start of evaporation process, which increases partial pressure of oxygen molecules. The oxygen, colliding or bonding with end surfaces 1a, 1b, 11a, and 11b of the laser chips 1 and 11, is highly likely to cause damage to the end surfaces 1a, 1b, 11a, and 11b. Further, in the case where active layers 3 and 13 of the laser chips 1 and 11 and vicinity layers thereof contain aluminum, the damage is considered to be larger. If thus-fabricated semiconductor laser device is operated with high output, necessary reliability may not be provided.

Further, according to the high output type semiconductor laser device disclosed in the Japanese Patent Laid-Open Publication HEI No. 1-289289, in forming protective coating 42a on the main emitting end surface 41a, the Si film 44 having high thermal conductivity is formed first for increasing reliability. In this case, there is formed first the Si film 44, which is free from generation of oxygen due to decomposition of the material in the process of evaporation, thereby enabling creation of a coating in the vicinity of the emitting end surface 41a of the laser chip 41 immediately after start of evaporation process under conditions of low partial pressure of oxygen. Therefore, in addition to increase of heat dissipation, there may be achieved an effect of controlling the above-stated damage in the vicinity of the emitting end surface 41a.

In this case, however, the Si film 44 has a thickness as high as approx. 532 Å (almost equal to $\lambda/4$), which may cause leakage current in the Si film 44 (light emitting end surface), and may affect oscillation characteristics of the semiconductor laser device.

SUMMARY OF THE INVENTION

Accordingly, it is an object of the present invention to provide a semiconductor laser device capable of reducing damages given to a light emitting end surface in creation of a protective coating, and of controlling generation of leakage current in the vicinity of the light emitting end surface, as well as to provide a method for manufacturing the same.

In order to achieve the above object, there is provided a semiconductor laser device, comprising: an oxide having a specified reflectance formed as a protective coating on light emitting end surfaces of a semiconductor laser chip; and an Si film having a film thickness of 40 Å or less formed between at least one light emitting end surface 51a and the oxide.

According to the above constitution, before an oxide is formed as a protective coating, there is formed an Si film, which is free from generation of oxygen due to decomposition. Consequently, creation of the coating is conducted immediately after start of Si film forming under conditions of low partial pressure of oxygen, which prevents oxygen with high energy from colliding or boding with the light emitting end surface. Further, if oxygen is decomposed in the process of oxide forming and so the oxygen partial pressure increases, collision or bonding of the oxygen with the light emitting end surface is prevented. Thus, the damages given to the light emitting end surface in the process of protective coating formation are controlled.

Here, if the semiconductor laser chip has an active layer including Al, the damages given to the light emitting end surface is effectively controlled.

In addition, the Si film has a film thickness as small as 40 Å or less. This reduces generation of leakage current in the Si film or on the light emitting end surface, thereby preventing negative influence on the oscillation characteristics.

In one embodiment of the present invention, the Si film has a film thickness of 5 Å or more and 30 Å or less.

According to the above constitution, the Si film has a film thickness of 5 Å or more and 30 Å or less, which almost eliminates generation of the leakage current.

In one embodiment of the present invention, the oxide constituting the protective coating is an $Al_2O_3$ film.

According to the above constitution, if the semiconductor laser chip is formed with GaAs, the refractive index of the oxide as the protective coating is smaller than the refractive index of the semiconductor laser chip, and therefore the reflectance of the protective coating is smaller than the reflectance of the light emitting end surface, regardless of the coating thickness. This increases optical output from the light emitting end surface.

In one embodiment of the present invention, the Si film has purity of 99.99% or more.

According to the above constitution, the Si film has purity of 99.99% or more. This ensures more effective prevention of oxygen with high energy from colliding or boding with the light emitting end surface.

Also, there is provided a method for manufacturing the semiconductor laser device, comprising a step of forming the Si film and the oxide on the light emitting end surface, the step being executed in succession within same equipment without exposing the surface to the air.

According to the above constitution, there is formed a semiconductor laser device, which decreases damages on the light emitting end surface and reduces generation of leakage current in the Si film or on the light emitting end surface, based on almost the same process as the background art.

Also, there is provided a method for manufacturing the semiconductor laser device, comprising a step of forming the Si film and the oxide through vacuum deposition.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The embodiments of the present invention will be described hereinafter in detail with reference to the accompanied drawings. First, the principles of the embodiments will be briefly described.

In forming a protective coating of a laser chip end surface by evaporation, the partial pressure of oxygen generated by decomposition of an oxide, that is a material of the protective coating, is rapidly increased. The oxygen with high energy colliding or bonding with the laser chip end surface exerts damages to the laser chip end surface, and damages reliability of the laser device. Therefore, it is necessary to control increase of the oxygen partial pressure immediately after start of evaporation process.

Accordingly, before the protective coating is formed, there is formed an Si film, which is free from generation of oxide due to decomposition of the material. This enables creation of the protective coating in the vicinity of the laser chip end surface under conditions of low partial pressure of oxygen. Also in the embodiments of the present invention, the Si film is formed to have a film thickness as small as approx. 40 Å or less. This makes it possible to eliminate generation of leakage current in the Si film (light emitting end surface) and prevents negative influence on oscillation characteristics of the laser device.

(First Embodiment)

Figure 1A:
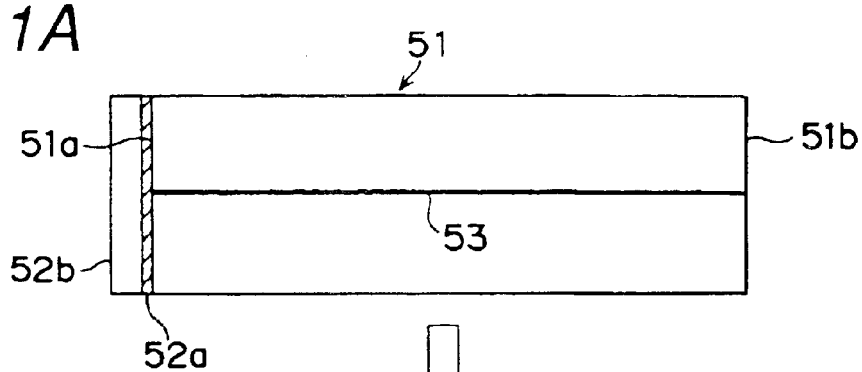
FIGS. 1A and 1B are schematic views showing a manufacturing method of a semiconductor laser device according to the present invention.
Figure 1B:
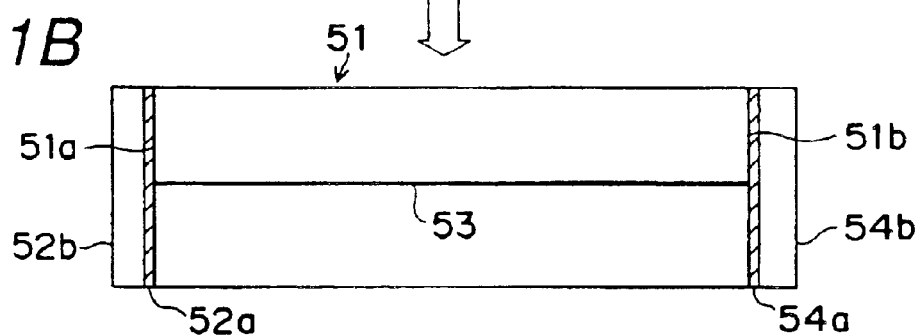

FIGS. 1A and 1B show procedures for forming a semiconductor laser device according to the present embodiment. As shown in FIG. 1A, there is formed an Si film 52a with a film thickness of approx. 20 Å on a light emitting end surface 51a of a laser chip 51 having an active layer 53 composed of aluminum including GaAlAs at a film creation speed of 1 Å/sec or less. Thus, there is formed first the Si film 52a, which is free from generation of oxygen due to decomposition of the material in the process of evaporation, thereby enabling creation of a coating in the vicinity of the light emitting end surface 51a of the laser chip 51 immediately after start of evaporation process under conditions of low partial pressure of oxygen. This prevents oxygen with high energy from colliding or bonding with the light emitting end surface 51a, and enables control of damages in the vicinity of the light emitting end surface 51a even in the case of the laser chip 51 having the active layer 53 composed of aluminium containing GaAlAs.

After the Si film 52a is formed as described above, there is formed in succession a protective coating 52b to have a specified coating thickness on the light emitting end surface 51a. If an evaporation material of the protective coating 52b is $Al_2O_3$, an appropriate speed for coating creation is around 30 Å/sec.

In the process of creating the protective coating 52b, oxygen is generated due to decomposition of the evaporation material $Al_2O_3$, which increases oxygen partial pressure. As previously described, however, the Si film 52a has been already formed, so that the oxygen will not directly collide or bond with the light emitting end surface 51a of the laser chip 51. Therefore, the damages in the vicinity of the light emitting end surface 51a may be controlled. In this case, the Si film 52a has a thickness as small as approx. 20 Å. This eliminates generation of leakage current in the Si film 52a (or the light emitting end surface 51a), and enables prevention of negative influence on oscillation characteristics of the laser device.

Figure 10:
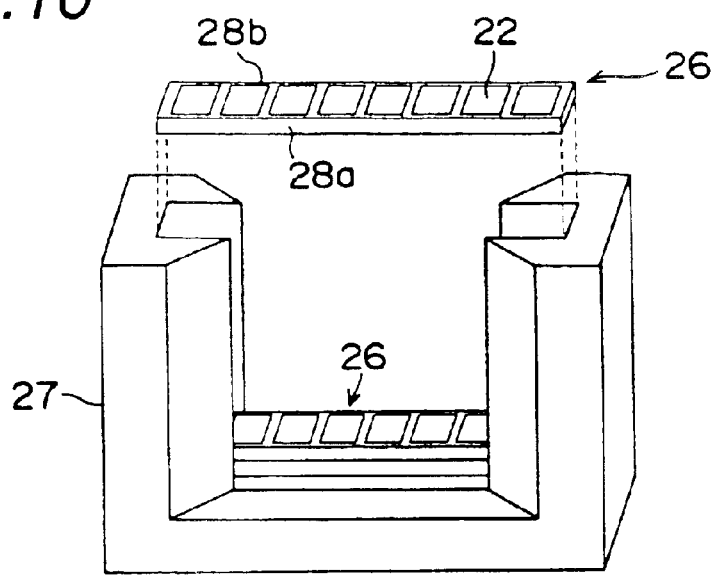
FIG. 10 is a schematic view showing a method for forming protective coatings after FIG. 9.

Here, the Si film 52a and the protective coating 52b are formed on the light emitting end surface 51a of the laser chip 51 as shown hereinafter. As shown in FIG. 10, a laser bar fixing device 27, in which laser bars 26 having a plurality of laser chips 51 formed thereon are stacked, is set in a holder 32 inside a chamber 30 in FIG. 11 such that the light emitting end surface 51a of the laser chip 51 faces a vapor source 31. Then, air in the chamber 30 is discharged through a duct 34. After a specified degree of vacuum is obtained, an evaporation material Si out of evaporation materials Si and $Al_2O_3$ put in the vapor source 31 is irradiated with electron beams to be evaporated for creation of an Si film 52a. Next, the evaporation material $Al_2O_3$ is irradiated with electron beams to be evaporated for creation of a protective coating 52b.

Figure 11:
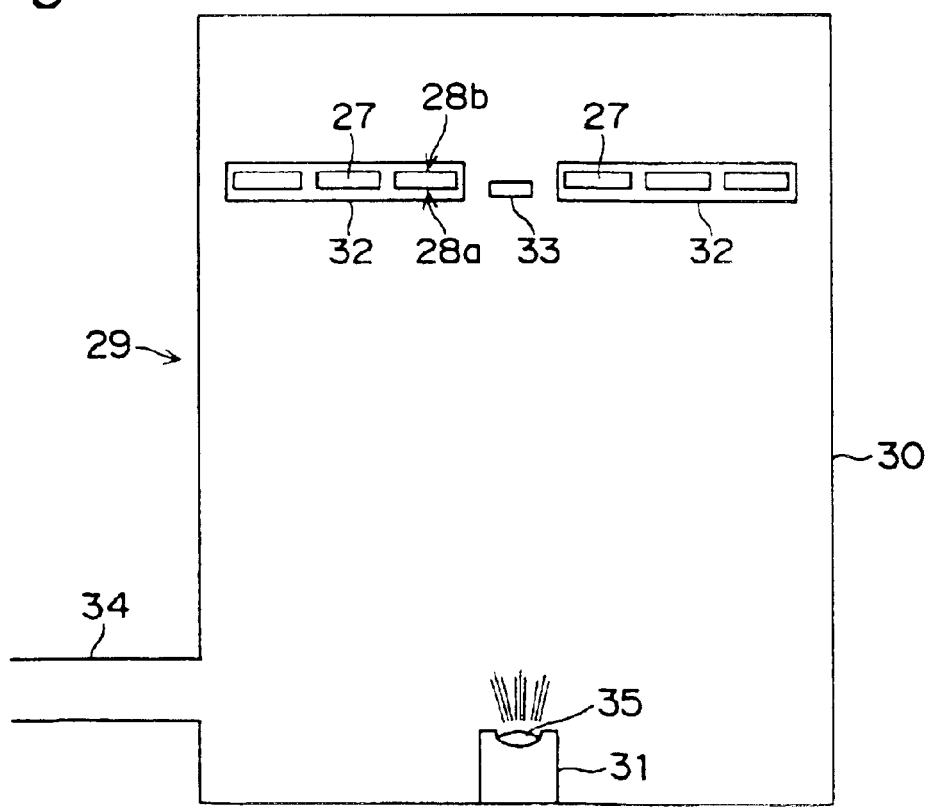
FIG. 11 is a schematic view showing a vacuum evaporator.
Figure 12:
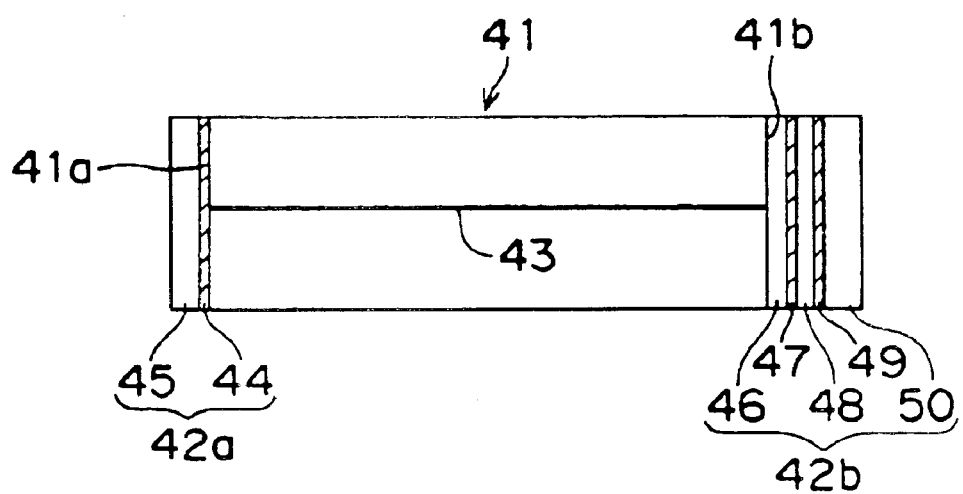
FIG. 12 is a schematic view showing a protective coating of a background art high output semiconductor laser device.

After coating creation on the light emitting end surface 51a side is completed, the holder 32 shown in FIG. 11 is inverted 180° for forming an Si film 54a with a film thickness of approx. 20 Å and a protective coating 54b on another light emitting end surface 51b. The method for forming the Si film 54a and the protective coating 54b is completely identical to the method for forming the Si film 52a and the protective coating 52b on the light emitting end surface 51a. In this case too, the Si film 54a free from generation of oxygen is formed first, which makes it possible to create a coating under conditions of low partial pressure of oxygen immediately after start of evaporation process, thereby enabling control of the damages in the vicinity of the end surface 51b. The Si film 54a has a thickness as small as approx. 20 Å. This eliminates generation of leakage current in the Si film 54a (or the light emitting end surface 51b), and enables prevention of negative influence on oscillation characteristics of the laser device.

(Second Embodiment)

Figure 2A:
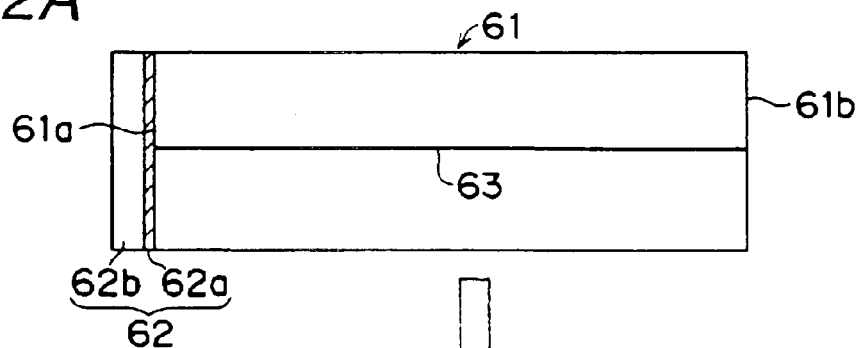
FIGS. 2A and 2B are schematic views showing a manufacturing method different from FIGS. 1A and 1B.
Figure 2B:
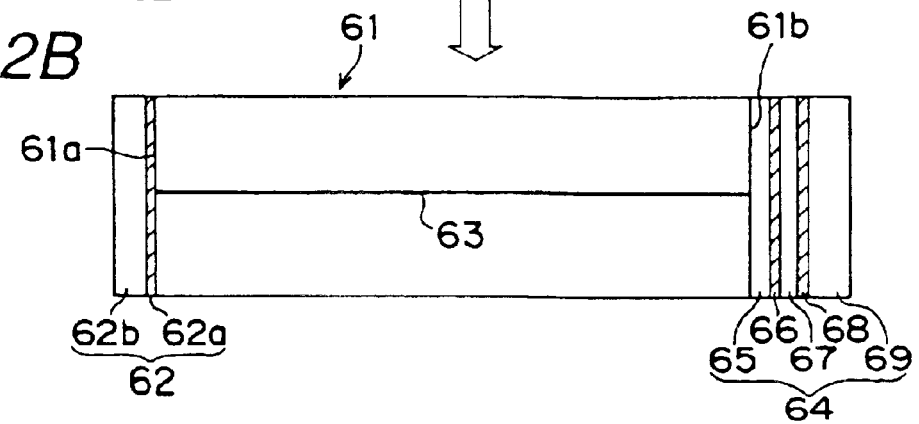

FIGS. 2A and 2B show procedures for forming a semiconductor laser device according to the present embodiment. In this embodiment, the basic embodiment shown in FIGS. 1A and 1B is applied to a semiconductor laser device having light emitting end surfaces different in reflectance (reflectance asymmetry: typically used for high output lasers, generally composed of a low reflecting protective coating having a single layered structure and a high reflecting protective coating having a multilayered structure).

Figure 7:
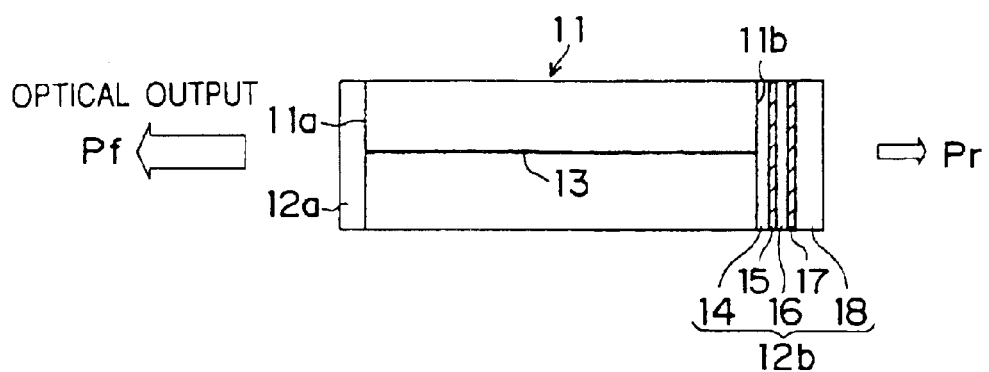
FIG. 7 is a schematic view showing a protective coating of a background art high output semiconductor laser device.
Figure 8:
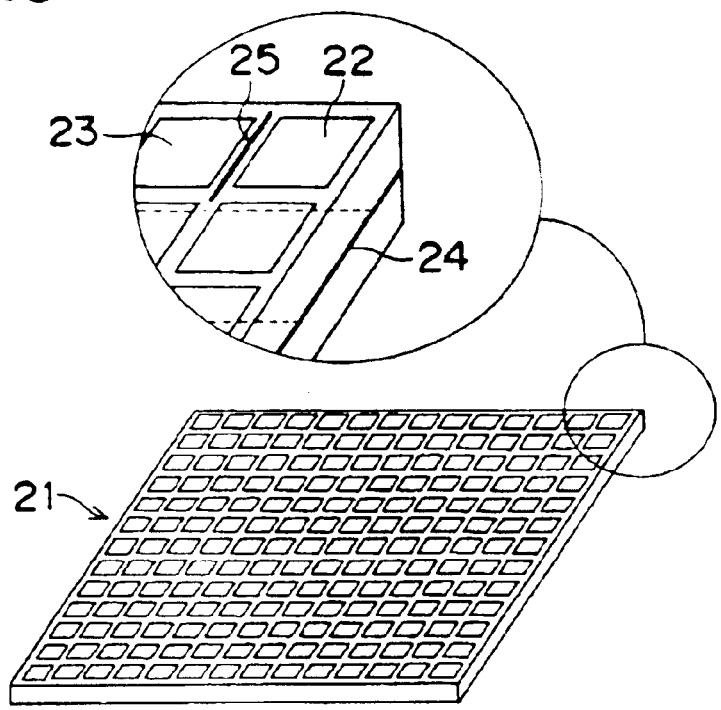
FIG. 8 is a schematic view showing a method for forming protective coatings of a semiconductor laser device.
Figure 9:
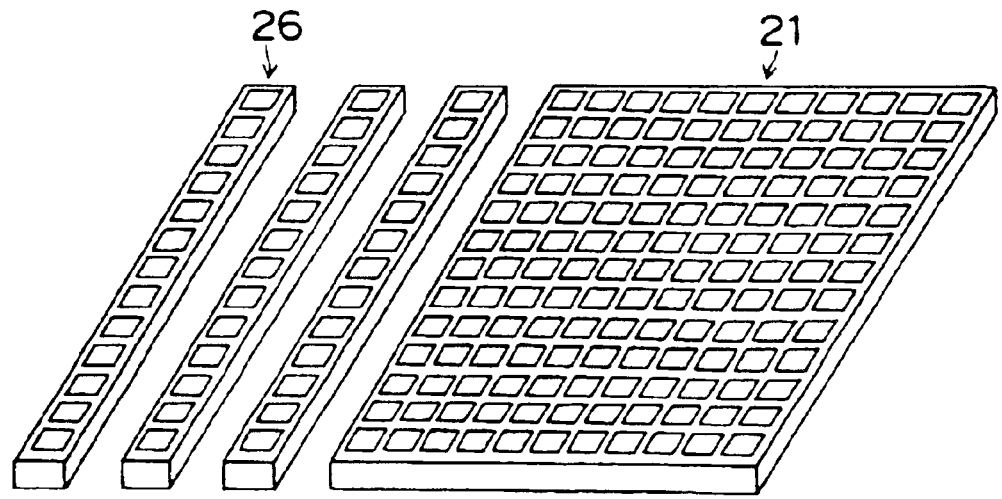
FIG. 9 is a schematic view showing a method for forming protective coatings after FIG. 8.

In the case of a high output type semiconductor laser device with optical output of approx. 20 mW or more, for increasing optical output from the side of a main emitting end surface 61a of a laser chip 61 having an active layer 63 composed of aluminum containing GaAlAs, generally the main emitting end surface 61a side is set to be low reflecting and a rear emitting end surface 61b side is set to be high reflecting like the case of FIG. 7.

Figure 6:
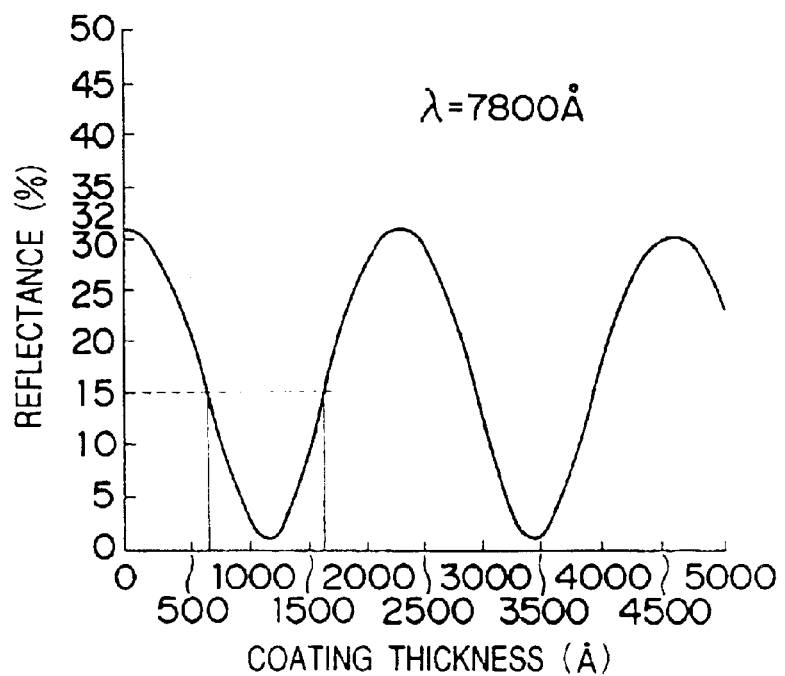
FIG. 6 is a view showing change of a reflectance corresponding to the film thickness of the protective coating of the semiconductor laser device of FIG. 5.

When an $Al_2O_3$ film and an Si film are used as materials of the protective coating, the protective coating on the side of the main emitting end surface is generally formed with an $Al_2O_3$ single layered film such that a reflectance thereof is as low as approx. 15% or less as described above. This low reflecting protective coating is set to have such coating thickness that is corresponding to a reflectance as low as 15% or less. More particularly, if calculated with a refractive index of an $Al_2O_3$ film equal to 1.60, a refractive index of a laser chip equal to 3.50, and an emission wavelength equal to $\lambda$=7800 Å, a coating thickness T corresponding to a reflectance of approx. 15% or less is about 700 Å to 1600 Å (see FIG. 6).

In the present embodiment, as shown in FIGS. 2A and 2B, a protective coating 62 on the side of the main emitting end surface 61a has two-layer structure composed of an Si film 62a with a film thickness of about 20 Å and an $Al_2O_3$ low reflecting protective coating 62b, similar to the first embodiment as described before. The method for coating formation is completely identical to that of the first embodiment.

The main emitting end surface 61a side is structured to have the Si film 62a between the low reflecting protective coating 62b and the main emitting end surface 61a. Compared to the single layered low reflecting protecting film 12a shown in FIG. 7, reflectance characteristics of this coating are considered to change. However, if the thickness of the Si film is around 20 Å, change of the reflectance characteristics is neglectable. If change is present, adjusting the coating thickness of the low reflecting protective film 62b may bring about a desired reflectance.

After creation of the protective coating 62 on the main emitting end surface 61a side is completed, the holder 32 shown in FIG. 11 is inverted 180° for forming a multilayered high reflecting protective coating 64 on another rear emitting end surface 61b. In the present embodiment, the multilayered high reflecting protective coating 64 is composed of a laminated structure made up of: a first layer 65 and a third layer 67 each consisting of an $Al_2O_3$ film with a thickness equal to $\lambda$/4; a second layer 66 and a fourth layer 68 each consisting of an Si film with a thickness equal to $\lambda$/4; and a fifth layer 69 consisting of an $Al_2O_3$ film with a thickness equal to $\lambda$/2. The multilayered high reflecting protective coating 64 has a reflectance as high as 85% or more. The method for creation of the multilayered high reflecting protective film 64 is equal to that of the multilayered high reflecting protective coating 12b shown in FIG. 7.

In the present embodiment too, for evaporating the protective coating 62 onto the main emitting end surface 61a of the laser chip 61, there is formed first the Si film 62a, which is free from generation of oxygen due to decomposition of the material in the process of evaporation, thereby enabling creation of a coating in the vicinity of the main emitting end surface 61a immediately after start of evaporation process under conditions of low partial pressure of oxygen. This prevents oxygen with high energy from colliding or bonding with the end surface 61a in the process of creating the Si film 62a. Further, in the later evaporation process of the low reflecting protective film 62b, if oxygen is generated due to decomposition of the evaporation material $Al_2O_3$, and oxygen partial pressure is increased, direct collision or bonding of the oxygen with the light emitting end surface 61a may be prevented. More particularly, even in the case of the laser chip 61 having an active layer 63 composed of aluminum containing GaAlAs, the damages in the vicinity of the main emitting end surface 61a may be controlled.

The Si film 62a has a thickness as small as approx. 20 Å. This eliminates generation of leakage current in the Si film 62a (or the light emitting end surface 61a), and enables prevention of negative influence on oscillation characteristics of the laser device.

(Third Embodiment)

Figure 3A:
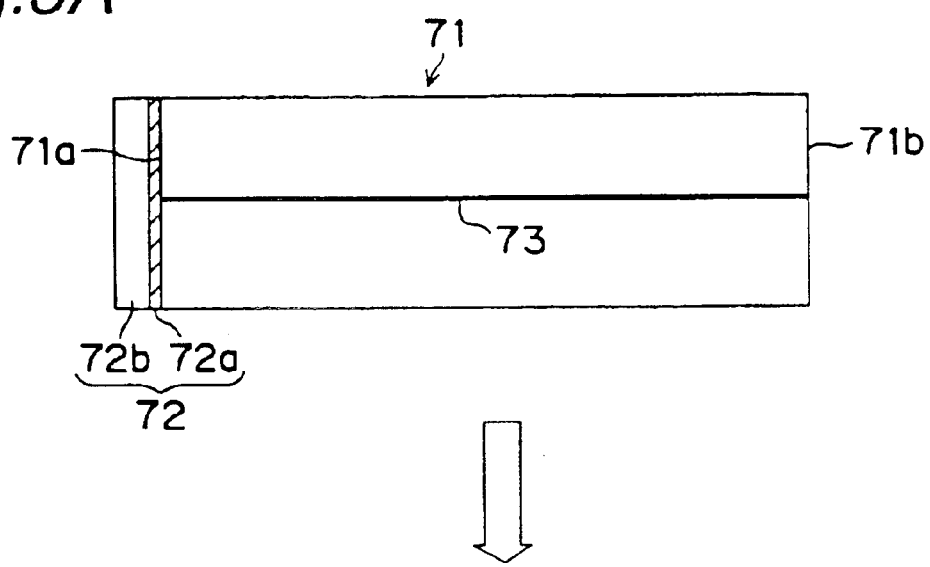
FIGS. 3A and 3B are schematic views showing a manufacturing method different from FIGS. 2 and 3.
Figure 3B:
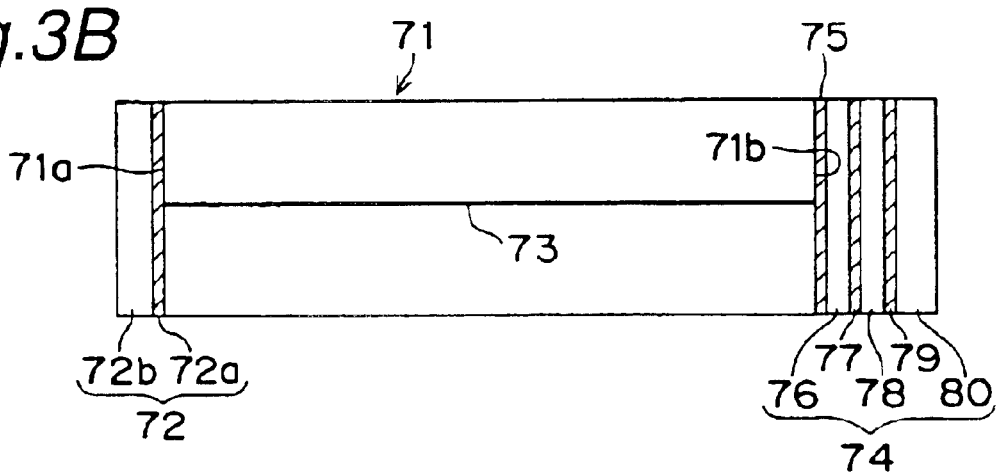

FIGS. 3A and 3B shows procedures for forming a semiconductor laser device according to the present embodiment. In this embodiment, the basic embodiment shown in FIGS. 1A and 1B is applied to the process of forming the multilayered high reflecting protective coating 64 on the side of the rear emitting end surface 61b according to the second embodiment.

In the case of a high output type semiconductor laser device, optical output from a main emitting end surface is higher than optical output from a rear emitting end surface. Consequently, sufficient effect is achieved even if the Si film 62a is formed only on the side of the main emitting end surface 61a as shown in the second embodiment. However, it is preferable to form an Si film also before forming the multilayered high reflecting protective coating 64 on the side of the rear emitting end surface 61b.

In this embodiment, similar to the second embodiment, an Si film 72a and a low reflecting protective coating 72b are formed on a main emitting end surface 71a of a laser chip 71 having an active layer 73 composed of aluminum containing GaAlAs. After that, also on the side of a rear emitting end surface 71b, there are formed an Si film 75 with a film thickness of 40 Å or less first, and then a multilayered high reflecting protective coating 74 in succession. As with the second embodiment, the multilayered high reflecting protective coating 74 is composed of a laminated structure made up of: a first layer 76 and a third layer 78 each consisting of an $Al_2O_3$ film with a thickness equal to $\lambda$/4; a second layer 77 and a fourth layer 79 each consisting of an Si film with a thickness equal to $\lambda$/4; and a fifth layer 80 consisting of an $Al_2O_3$ film with a thickness equal to $\lambda$/2.

In the present embodiment as described above, for creating the multilayered high reflecting protective coating 74 on the rear emitting end surface 71b of the laser chip 71, there is formed first the Si film 75, which is free from generation of oxygen due to decomposition of the material in the process of evaporation, thereby enabling prevention of the damages in the vicinity of the rear emitting end surface 71b.

Figure 4A:
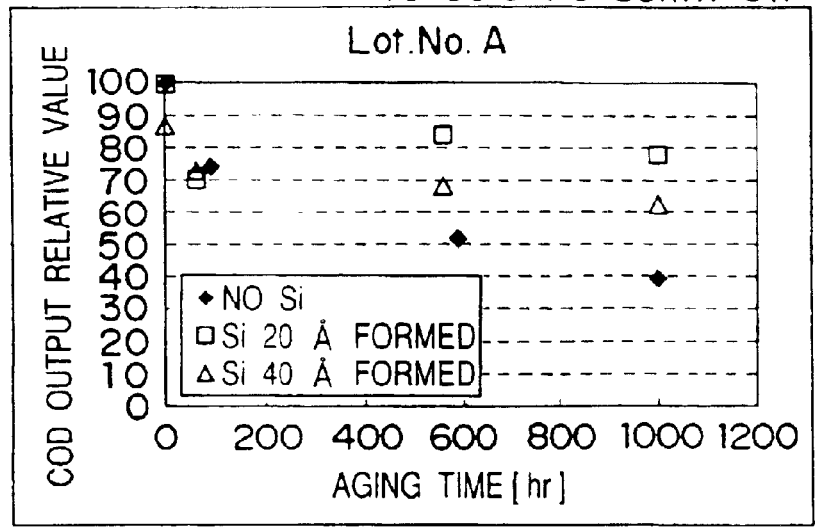
FIGS. 4A to 4C are views each showing relation between the film thickness of an Si film formed between a light emitting end surface and a protective coating and a COD value changed with the lapse of time.
Figure 4B:
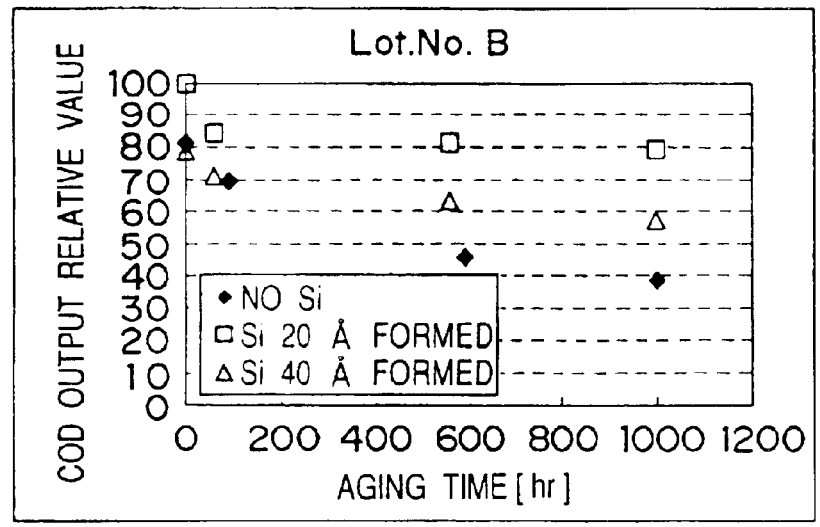
Figure 4C:
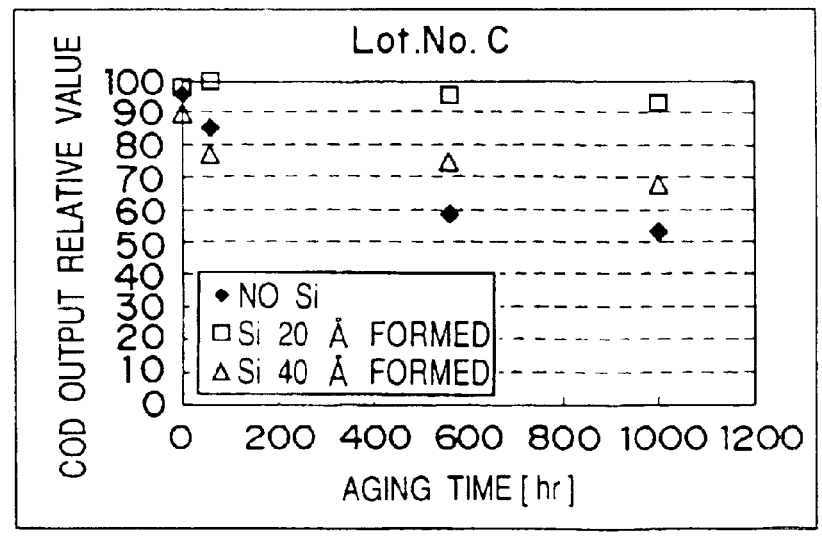
Figure 5:
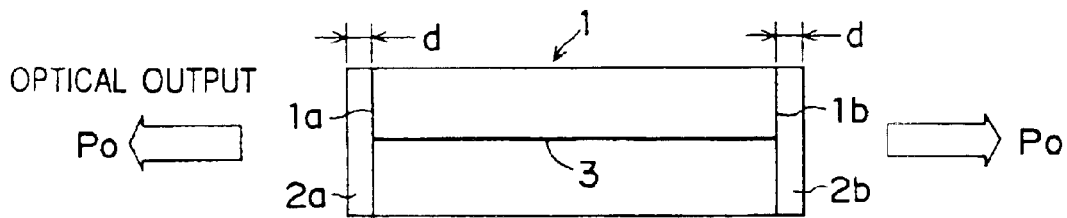
FIG. 5 is a schematic view showing a protective coating of a background art semiconductor laser device.

For evaluating reliability of the semiconductor laser device, there is a method for comparing COD values (catastrophic optical damage level) of formed semiconductor laser devices changed with the lapse of time. FIG. 4 shows three lots of the COD value of a semiconductor laser device changed with the lapse of time, each lot showing a case of forming no Si film, a case of forming an Si film with a film thickness of 20 Å, and a case of forming an Si film with a film thickness of 40 Å, each between a light emitting end surface and a protective coating of a laser chip. In FIG. 4, as a result of comparing each COD value at the point after the lapse of approx. 1000 hours, each slot indicated the following.

$$20 \text{ Å} > 40 \text{ Å} > 0 \text{ Å}$$

Consequently, it was confirmed that forming an Si film between the light emitting end surface and the protective coating makes it possible to control decrease of the COD value of the semiconductor laser device and to improve reliability. Further, the case of forming the Si film with a film thickness of 20 Å gave a good result. The above result indicates that the appropriate film thickness of an Si film formed between the light emitting end surface and the protective coating of a laser chip is 40 Å or less, preferably 5 Å to 30 Å.

Si used in each of the above embodiments preferably has purity of 99.99% or more. The method for forming each protective coating is not limited to evaporation, but other film creation methods including sputtering and CVD (chemical vapor deposition method) are also applicable. Further, the material of the low reflecting protective coating includes not only $Al_2O_3$ but also oxide such as $SiO_2$ and $TiO_2$.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device, comprising:
    an oxide formed as a protective coating on at least one light emitting end surface of a semiconductor laser chip;
    an Si film having a film thickness of 40 Å or less formed between the at least one light emitting end surface and the oxide protective coating; and
    wherein the semiconductor laser device includes an active layer comprised of GaAlAs, wherein said active layer is uniform with respect to absorption of an emission wavelength throughout its length including at respective end portions thereof.

2. The semiconductor laser device as claimed in claim 1, wherein the Si film has a film thickness of from 5 Å to 30 Å.

3. The semiconductor laser device as claimed in claim 1, wherein the oxide protective coating comprises $Al_2O_3$.

4. The semiconductor laser device as claimed in claim 1, wherein the Si film has a silicon purity of 99.99% or more.

5. A method for manufacturing the semiconductor laser device as claimed in claim 1, comprising forming the Si film and the oxide on the at least one light emitting end surface in succession within same equipment without exposing the surface to the air.

6. A method for manufacturing the semiconductor laser device as claimed in claim 1, comprising forming the Si film and the oxide through vacuum deposition.

7. The laser device of claim 1, wherein the oxide protective coating comprises $Al_2O_3$.

8. A semiconductor laser device, comprising:
    a semiconductor laser chip;
    a protective coating comprising $Al_2O_3$ formed on a light emitting end surface of the semiconductor laser chip;
    an intermediate film comprising silicon having a thickness of 40 Å or less formed between the light emitting end surface of the chip and the protective coating comprising $Al_2O_3$; and
    wherein the semiconductor laser device includes an active layer comprised of GaAlAs, wherein said active layer is uniform with respect to absorption of an emission wavelength throughout its length including at respective end portions thereof.

* * * * *